(12) United States Patent
Yogendra et al.

(10) Patent No.: US 10,978,573 B2
(45) Date of Patent: Apr. 13, 2021

(54) SPACER-CONFINED EPITAXIAL GROWTH (71) Applicant: INTERNATIONAL BUSINESS MACHINES CORPORATION, Armonk, NY (US)

(72) Inventors: Karthik Yogendra, Albany, NY (US); Ardasheir Rahman, Schenectady, NY (US); Robert Robison, Colchester, VT (US); Adra Carr, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/504,739

(22) Filed: Jul. 8, 2019

(65) Prior Publication Data

US 2021/0013321 A1   Jan. 14, 2021

(51) Int. Cl.
*H01L 29/66* (2006.01)
*H01L 21/8234* (2006.01)
*H01L 21/8238* (2006.01)
*H01L 29/06* (2006.01)
*H01L 27/092* (2006.01)
*H01L 29/78* (2006.01)
*H01L 29/08* (2006.01)

(52) U.S. Cl.
CPC .......... *H01L 29/66545* (2013.01); *H01L 21/823468* (2013.01); *H01L 21/823821* (2013.01); *H01L 27/0924* (2013.01); *H01L 29/0649* (2013.01); *H01L 29/0847* (2013.01); *H01L 29/6653* (2013.01); *H01L 29/66795* (2013.01); *H01L 29/785* (2013.01); *H01L 29/7848* (2013.01)

(58) Field of Classification Search
CPC ....... H01L 29/66545; H01L 21/823468; H01L 21/823821; H01L 29/6653; H01L 29/0649; H01L 27/0924; H01L 29/785; H01L 29/66795; H01L 29/0847; H01L 29/7848
See application file for complete search history.

(56) References Cited

U.S. PATENT DOCUMENTS

| | | | |
|---|---|---|---|
| 9,293,459 B1 | 3/2016 | Cheng et al. | |
| 9,318,582 B2 | 4/2016 | Basker et al. | |
| 9,704,753 B2 | 7/2017 | Cheng et al. | |
| 9,716,158 B1 | 7/2017 | Cheng et al. | |
| 9,923,055 B1 * | 3/2018 | Cheng | H01L 29/42392 |
| 10,128,334 B1 | 11/2018 | Bourjot et al. | |

(Continued)

OTHER PUBLICATIONS

N. Loubet et al., "Stacked Nanosheet Gate-All-Around Transistor to Enable Scaling Beyond FinFET", 2017 Symposium on VLSI Technology Digest of Technical Papers, Jun. 2017.

*Primary Examiner* — Fernando L Toledo
*Assistant Examiner* — Adam S Bowen
(74) *Attorney, Agent, or Firm* — Tutunjian & Bitetto, P.C.; Randall Bluestone (57) ABSTRACT

Semiconductor devices and methods of forming the same include forming a dummy gate on a stack of alternating channel layers and sacrificial layers. A spacer layer is formed over the dummy gate and the stack. Portions of the spacer layer on horizontal surfaces of the stack are etched away to form vertical spacers. Exposed portions of the stack are etched away. Semiconductor material is grown from exposed sidewalls of remaining channel layers to form source and drain structures that are constrained in lateral dimensions by the vertical spacers.

20 Claims, 5 Drawing Sheets

(56) References Cited

U.S. PATENT DOCUMENTS

| | | |
|---|---|---|
| 2015/0129939 A1* | 5/2015 | Alptekin ................ H01L 29/78 257/288 |
| 2016/0005868 A1 | 1/2016 | Wei et al. |
| 2016/0233319 A1 | 8/2016 | Lu et al. |
| 2018/0047832 A1 | 2/2018 | Tapily et al. |
| 2018/0083113 A1 | 3/2018 | Balakrishnan et al. |
| 2018/0254329 A1 | 9/2018 | Guillom et al. |

* cited by examiner

SPACER-CONFINED EPITAXIAL GROWTH

BACKGROUND

The present invention generally relates to semiconductor device fabrication and, more particularly, to the fabrication of devices with decreased parasitic capacitance between a gate and epitaxially grown source and drain structures.

During the fabrication of certain semiconductor devices, such as fin field effect transistors (FETs) and nanowire/nanosheet FETs, source and drain regions can be epitaxially grown from a channel structure. When the epitaxial growth is unconstrained, the source and drain regions can grow to widths that exceed the width of the channel, which can lead to a high capacitance between the gate and the source/drain structures. This capacitance impacts device delay and, hence, device performance.

SUMMARY

A method of forming a semiconductor device includes forming a dummy gate on a stack of alternating channel layers and sacrificial layers. A spacer layer is formed over the dummy gate and the stack. Portions of the spacer layer on horizontal surfaces of the stack are etched away to form vertical spacers. Exposed portions of the stack are etched away. Semiconductor material is grown from exposed sidewalls of remaining channel layers to form source and drain structures that are constrained in lateral dimensions by the vertical spacers.

A method of forming a semiconductor device includes forming a dummy gate on a stack of alternating channel layers and sacrificial layers that are formed from distinct semiconductor materials. A spacer layer is formed over the dummy gate and the stack. Portions of the spacer layer on horizontal surfaces of the stack are etched away to form vertical spacers. Exposed portions of the stack are etched away. Semiconductor material is epitaxially grown from exposed vertical sidewall surfaces of remaining channel layers of the stack to form source and drain structures that are constrained in lateral dimensions by the vertical spacers. An interlayer dielectric is formed over the source and drain structures and over the vertical spacers from a distinct material as compared to material of the vertical spacers.

A semiconductor device includes vertically arranged channel layers. A source structure and a drain structure are formed at respective ends of the vertically arranged channel layers. A vertical sidewall spacer is formed on sidewalls of the source structure and the drain structure. A gate stack is formed over, around, and between the vertically arranged channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form field effect transistors (FETs) with epitaxially grown source and drain regions that are constrained in the extent of their lateral growth. The present embodiments deposit a spacer after the formation of a dummy gate structure. This spacer is anisotropically etched to expose an underlying semiconductor stack. The stack can then be etched away to form, e.g., nanosheets with exposed channel ends. When source and drain structures are grown from the exposed channel ends, they are prevented from growing laterally beyond the vertical remnants of the spacers. This decreases the parasitic capacitance of the device, between the gate and epitaxially grown source and drain regions, and improves device performance.

Figure 1:
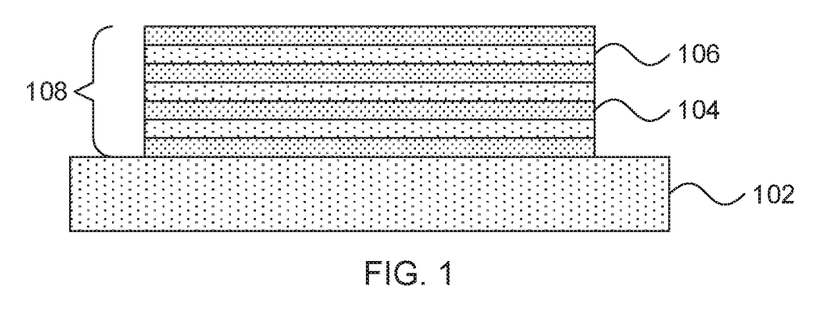
FIG. 1 is a cross-sectional view of a step in the formation of a nanosheet semiconductor device with reduced gate-to-source/drain parasitic capacitance that shows a stack of alternating channel and sacrificial semiconductor layers in accordance with an embodiment of the present invention.

Referring now to the drawings in which like numerals represent the same or similar elements and initially to FIG. 1, a cross-sectional diagram of a step in forming FETs with constrained source/drain epitaxial growth is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

A stack of alternating semiconductor layers 108 is formed on the semiconductor substrate 102. Layers of a first channel material 104 alternate with layers of a second channel material 106. The first and second channel materials have etch selectivity with respect to one another. As used herein, the term "selective" in reference to a material removal process denotes that the rate of material removal for a first material is greater than the rate of removal for at least another material of the structure to which the material removal process is being applied. In one specific embodiment, etch selectivity denotes a ratio of etch rates between an etched material and other materials of at least 10:1.

In one specific embodiment, the first layers of channel material are formed from silicon germanium and the second layers of channel material are formed from silicon. These two materials have etch selectivity with respect to one another, such that the material of one set of layers can be removed without substantially affecting the material of the other layers. It should be understood, however, that any appropriate combination of semiconductor materials having etch selectivity with respect to one another may be used instead. In further embodiments, an etch stop layer can be formed between the bottommost sacrificial layer and the substrate 102 that can be formed from, e.g., silicon germanium that has a different germanium concentration relative to that of the sacrificial layers.

The stack of alternating semiconductor layers 108 may be formed by any appropriate deposition process, including for example chemical vapor deposition (CVD), atomic layer deposition (CVD), physical vapor deposition (PVD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Alternatively, the stack 108 can be formed by epitaxially growing the respective layers from one another. The terms "epitaxial growth and/or deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 2:
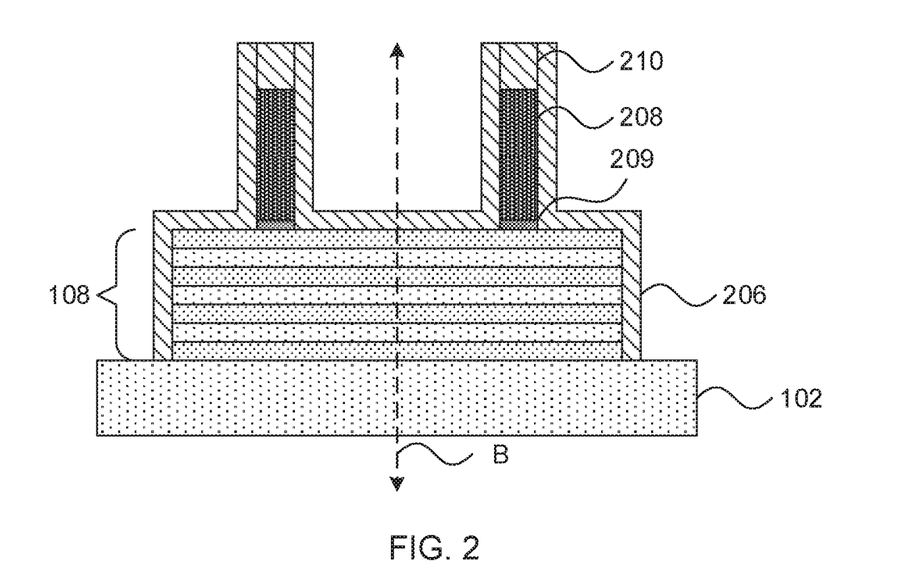
FIG. 2 is a cross-sectional view of a step in the formation of a nanosheet semiconductor device with reduced gate-to-source/drain parasitic capacitance that shows dummy gates and a layer of spacer material being formed on the stack of alternating layers in accordance with an embodiment of the present invention.

Referring now to FIG. 2, a cross-sectional diagram of a step in forming FETs with constrained source/drain epitaxial growth is shown. Dummy gates 208 are formed on the stack 108 from any appropriate material such as, e.g., polysilicon or amorphous silicon and are separated from the underlying stack of alternating semiconductor layers 108 by an insulator pad 209. The dummy gates 208 are surrounded by an insulator layer formed from, e.g., a gate pattern hardmask 210 and a spacer 206. It is specifically contemplated that the gate pattern hardmask 210 and the spacer 206 may be formed from any appropriate hardmask material such as, e.g., silicon nitride, but any appropriate dielectric material can be used instead.

The dummy gates 208 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form the gate pattern hardmask 210. Although two dummy gates 208 are shown, it should be understood that any appropriate number of dummy gates can be formed over the stack 108. Next, the photoresist pattern is removed and the gate pattern is then transferred into the dummy gate material during an anisotropic selective etching process, such as reactive ion etching (RIE).

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

FIG. 2 further shows a dashed line that indicates a cross-sectional plane perpendicular to the channels and parallel to the dummy gates 208. The orientation shown in FIG. 2 will be referred to hereinafter as cross-section A, while the orientation indicated by the dashed line will be referred to hereinafter as cross-section B.

Figure 3:
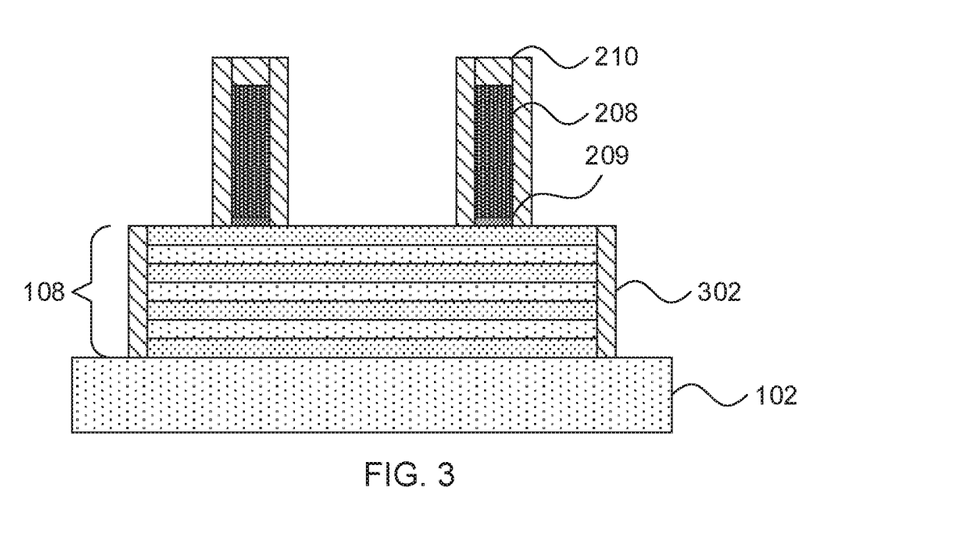
FIG. 3 is a cross-sectional view of a step in the formation of a nanosheet semiconductor device with reduced gate-to-source/drain parasitic capacitance that shows the removal of spacer material from horizontal surfaces to form vertical spacers in accordance with an embodiment of the present invention.

Referring now to FIG. 3, a cross-sectional diagram of a step in forming FETs with constrained source/drain epitaxial growth is shown along cross-section A. An anisotropic etch is performed to remove material from the spacer 206 from horizontal surfaces. The etch is selective to the spacer material to prevent damage to the stack 108.

Figure 4:
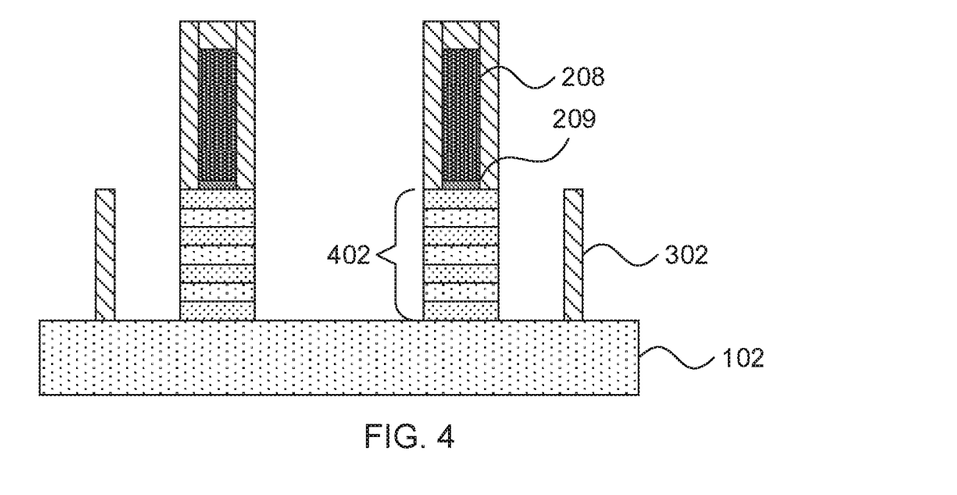
FIG. 4 is a cross-sectional view of a step in the formation of a nanosheet semiconductor device with reduced gate-to-source/drain parasitic capacitance that shows the removal of material from the stack of alternating layers in regions that are not covered by the dummy gates in accordance with an embodiment of the present invention.

Referring now to FIG. 4, a cross-sectional diagram of a step in forming FETs with constrained source/drain epitaxial growth is shown along cross-section A. One or more anisotropic etches are used to etch down the layers of the stack 108 to form fin(s) 402, using the dummy gate 208 and the spacers 302 as a mask.

Figure 5:
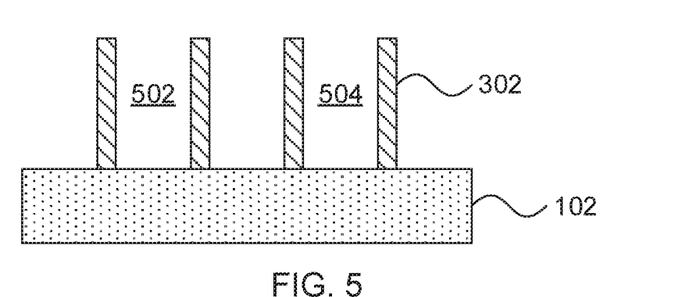
FIG. 5 is a cross-sectional view across a source/drain region of a step in the formation of a nanosheet semiconductor device with reduced gate-to-source/drain parasitic capacitance that shows the position of the vertical spacers establishing a space at the ends of the channel layers in accordance with an embodiment of the present invention.

Referring now to FIG. 5, a cross-sectional diagram of a step in forming FETs with constrained source/drain epitaxial growth is shown along cross-section B. This view shows a space in a p-type region 502 between fins spacers 302 that is empty after the removal of the stack of semiconductors and a space in an n-type region 504 between fin spacers 302 that is similarly empty. The spacers 302 remain, having previously stood as sidewalls of the stack 108. This figure illustrates that multiple devices with multiple conductivity types can be formed, using the present embodiments, at the same time.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous.

Figure 6:
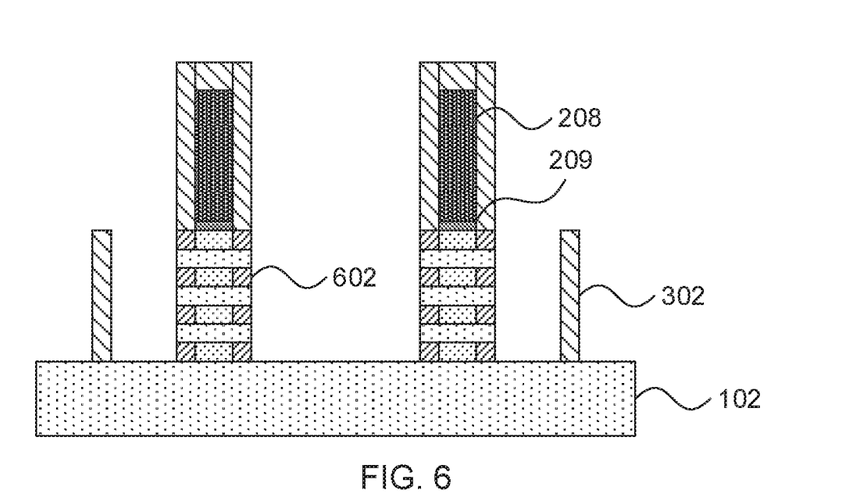
FIG. 6 is a cross-sectional view across the stacks of alternating layers of a step in the formation of a nanosheet semiconductor device with reduced gate-to-source/drain parasitic capacitance that shows the position of the vertical spacers establishing a space at the ends of the channel layers in accordance with an embodiment of the present invention.

Referring now to FIG. 6, a cross-sectional diagram of a step in forming FETs with constrained source/drain epitaxial growth is shown along cross-section A. The sacrificial layers 104 of the fins 402 are recessed using, e.g., a selective isotropic etch. The resulting recesses are then filled in with an appropriate dielectric material, selectively etchable relative to the material of the spacers 302, to form inner spacers 602. This can be performed, for example, by conformally depositing the inner spacer dielectric material and then anisotropically etching away any inner spacer dielectric material that is exposed.

Figure 7:
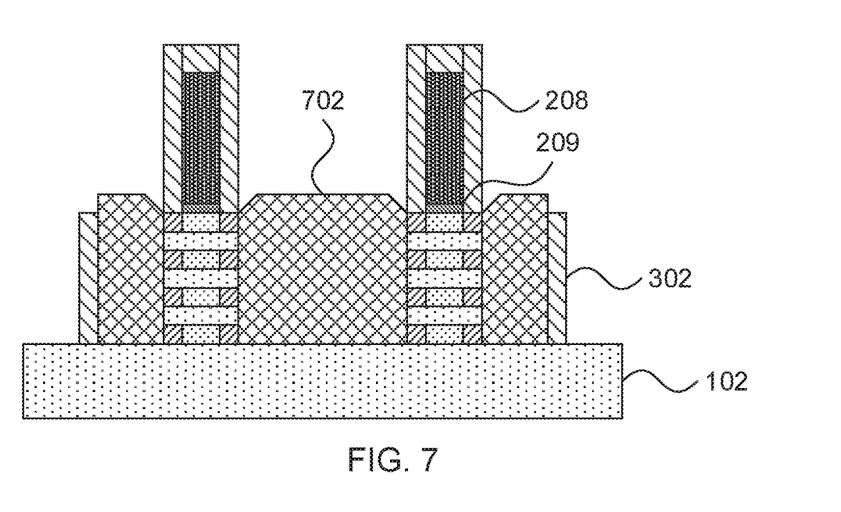
FIG. 7 is a cross-sectional view across the stacks of alternating layers of a step in the formation of a nanosheet semiconductor device with reduced gate-to-source/drain parasitic capacitance that shows the growth of source and drain structures that is constrained by the vertical spacers in accordance with an embodiment of the present invention.

Referring now to FIG. 7, a cross-sectional diagram of a step in forming FETs with constrained source/drain epitaxial growth is shown along cross-section A. Source and drain structures 702 are epitaxially grown from exposed vertical surfaces (sidewalls) of the channel layers 106 in the fins 402, while horizontal surfaces above and below the channel layers 106 are covered by the sacrificial layers 104. The lateral growth of the source/drain structures 702 is constrained by the presence of the spacers 302.

Figure 8:
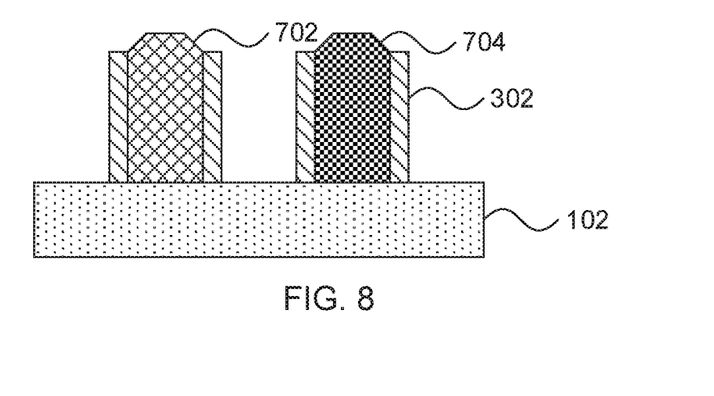
FIG. 8 is a cross-sectional view across a source/drain region of a step in the formation of a nanosheet semiconductor device with reduced gate-to-source/drain parasitic capacitance that shows the growth of source and drain structures that is constrained by the vertical spacers in accordance with an embodiment of the present invention.

Referring now to FIG. 8, a cross-sectional diagram of a step in forming FETs with constrained source/drain epitaxial growth is shown along cross-section B. Respective growth processes are used to form p-type source/drain structures 702 and n-type source/drain structures 704. As can be seen in this view, the lateral growth of the source/drain structures 702/704 is constrained in the direction parallel to the dummy gates 208 by the spacers 302. Limiting the growth of the source/drain structures 702/704 in this dimension limits the capacitance between the source/drain structures 702 and the gate of the respective finished device. If the spacers 302 were not present, then the epitaxial growth process could cause the source/drain structures to grow rapidly in lateral directions, creating a significant amount of surface area that is not needed for the successful operation of the device, but that results in unnecessarily high capacitances. In some embodiments, limiting the lateral growth of the source/drain structures 702/704 has been shown to reduce the capacitance between the gate and the source/drain structures by about 20%. At this point, the dummy gate 208 can be replaced with a gate structure and contacts can be formed to the gate structure and to the source/drain structures 702/704 to finish the device.

Figure 10:
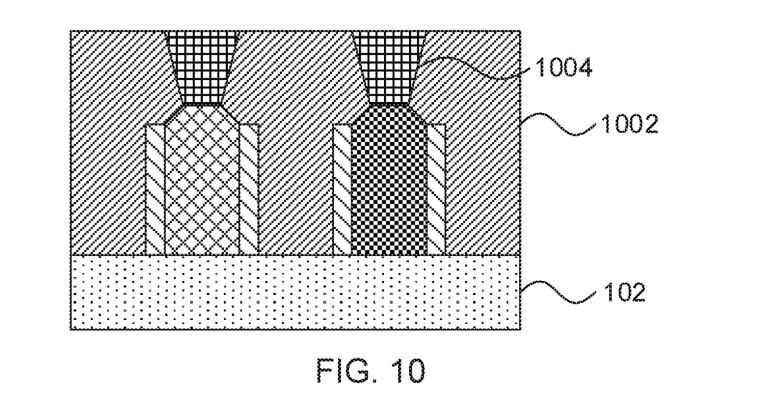
FIG. 10 is a cross-sectional view across a source/drain region of a step in the formation of a nanosheet semiconductor device with reduced gate-to-source/drain parasitic capacitance that shows the formation of an interlayer dielectric and conductive contacts in accordance with an embodiment of the present invention.

Referring now to FIG. 10, a cross-sectional diagram of a step in forming FETs with constrained source/drain epitaxial growth is shown along cross-section B. An interlayer dielectric 1002 has been deposited over the device(s) and may be formed from, e.g., silicon dioxide using any appropriate deposition process such as, e.g., a flowable CVD or spin-on deposition. Although silicon dioxide is specifically contemplated, it should be understood that any appropriate dielectric material can be used instead. Vias are formed in the interlayer dielectric 1002 and conductive contacts 1004 are formed in the vias to form electrical contacts to the source/drain regions 702/704.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
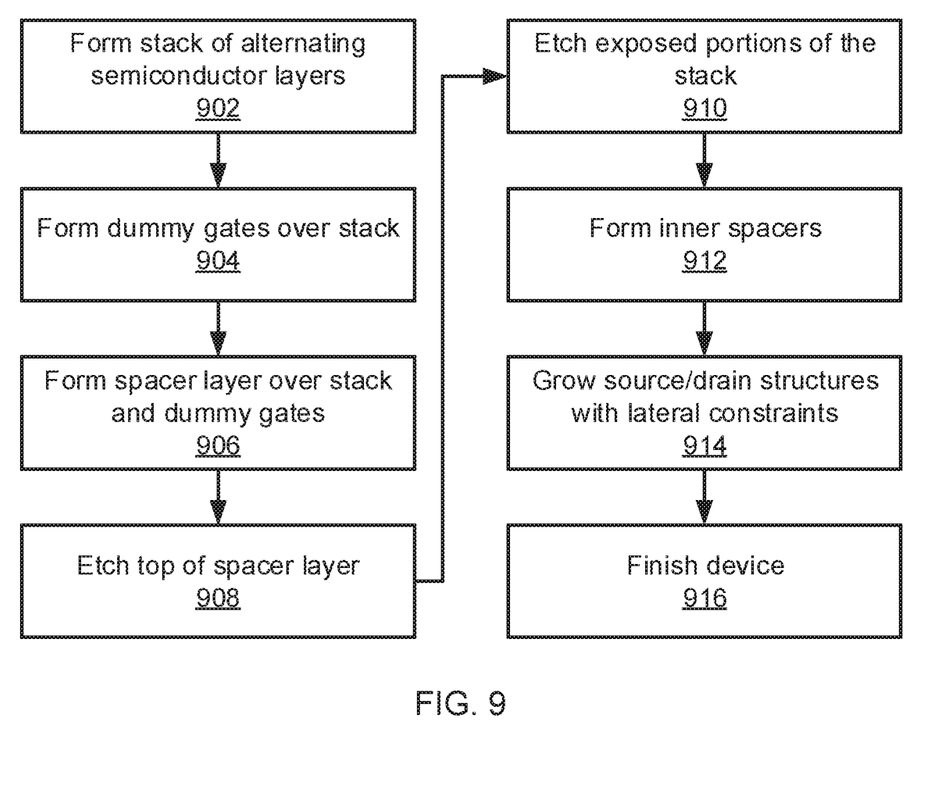
FIG. 9 is a block/flow diagram of a method for forming a nanosheet semiconductor device with reduced gate-to-source/drain parasitic capacitance in accordance with an embodiment of the present invention.

Referring now to FIG. 9, a method of forming a semiconductor device with reduced parasitic capacitance is shown. Block 902 forms a stack 108 of semiconductor layers, including sacrificial layers 104 and channel layers 106. The 108 stack can be formed by, e.g., epitaxially growing crystallographically compatible layers from one another. The stack 108 can further be patterned using photolithography and one or more anisotropic etches.

Block 904 forms one or more dummy gates 208 over the stack 108 using, e.g., photolithography and an anisotropic etch. Block 906 then conformally forms a spacer layer 206 over the dummy gates 208 and the stack 108 using any appropriate conformal deposition process. Block 908 etches the top of the spacer layer 206, using a selective anisotropic etch, leaving behind vertical spacers 302.

Block 910 etches down the exposed portions of the stack 108, leaving fin stacks 402. This can include, for example, alternating etches that selectively remove material from the respective alternating layers. In another embodiment, an etch stop layer can be formed underneath the stack, such that a single etch can be used to etch down to the etch stop layer. Block 912 forms inner spacers by recessing the sacrificial layers 104 and depositing dielectric material in the recesses. Excess dielectric material is removed by an anisotropic etch.

Block 914 epitaxially grows source/drain structures 702/704 from the exposed sides of the channel layers 106. It should be understood that this block can represent multiple epitaxial growth processes, for example for p-type in situ doped source/drain structures 702 and n-type in situ doped source/drain structures 704. Any number of such epitaxial growth processes can be used for any number of different source/drain configurations, for example differing by conductivity type, dopant species, and dopant concentration.

The growth of the source/drain structures 702/704 is constrained by the vertical spacers 302, preventing them from growing farther in the direction parallel to the dummy gates 208. Block 916 then finishes the device, for example by replacing the dummy gates 108 with an appropriate gate stack (e.g., including a gate dielectric and a gate conductor), depositing an interlayer dielectric, and forming conductive contacts through the interlayer dielectric to make electrical connection to the source/drain structures 702/704 and the gate conductor.

Having described preferred embodiments of spacer-confined epitaxial growth (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a dummy gate on a stack of alternating channel layers and sacrificial layers;
   forming a spacer layer over the dummy gate and the stack;
   etching away portions of the spacer layer on horizontal surfaces of the stack to form vertical spacers;
   etching away exposed portions of the stack after etching away the portions of the spacer layer; and
   growing semiconductor material from exposed sidewalls of remaining channel layers to form source and drain structures that are constrained in lateral dimensions by the vertical spacers.

2. The method of claim 1, wherein etching away the portions of the spacer layer comprises an anisotropic etch that preferentially removes material in a vertical direction.

3. The method of claim 1, wherein etching away portions of the stack comprises an anisotropic etch that selectively removes material from the stack in a vertical direction, leaving behind a channel portion of the stack under the dummy gate and the vertical spacers.

4. The method of claim 3, further comprising horizontally recessing the sacrificial layers in the channel portion of the stack relative to sidewalls of the channel layers of the channel portion of the stack.

5. The method of claim 4, further comprising forming inner spacers, on sidewalls of the recessed sacrificial layers, that cover exposed top and bottom surfaces of the channel layers in the channel portion of the stack.

6. The method of claim 1, wherein growing semiconductor material comprises epitaxial growth of semiconductor material from exposed vertical surfaces of the channel layers under the dummy gates.

7. The method of claim 1, further comprising an interlayer dielectric formed over the source and drain structures and over the vertical spacers.

8. The method of claim 7, wherein the interlayer dielectric is formed from a distinct material as compared to a material of the vertical spacers.

9. A method for forming a semiconductor device, comprising:
   forming a dummy gate on a stack of alternating channel layers and sacrificial layers that are formed from distinct semiconductor materials;
   forming a spacer layer over the dummy gate and the stack;
   etching away portions of the spacer layer on horizontal surfaces of the stack to form vertical spacers;
   etching away exposed portions of the stack after etching away the portions of the spacer layer;
   epitaxially growing semiconductor material from exposed vertical sidewall surfaces of remaining channel layers of the stack to form source and drain structures that are constrained in lateral dimensions by the vertical spacers; and
   forming an interlayer dielectric over the source and drain structures and over the vertical spacers from a distinct material as compared to material of the vertical spacers.

10. The method of claim 9, wherein etching away the portions of the spacer layer comprises an anisotropic etch that preferentially removes material in a vertical direction.

11. The method of claim 9, wherein etching away portions of the stack comprises an anisotropic etch that selectively removes material from the stack in a vertical direction, leaving behind a channel portion of the stack under the dummy gate and the vertical spacers.

12. The method of claim 11, further comprising horizontally recessing the sacrificial layers in the channel portion of the stack relative to sidewalls of the channel layers of the channel portion of the stack.

13. The method of claim 12, further comprising forming inner spacers, on sidewalls of the recessed sacrificial layers, that cover exposed top and bottom surfaces of the channel layers in the channel portion of the stack.

14. A semiconductor device, comprising:
   a plurality of vertically arranged channel layers;
   a source structure and a drain structure at respective ends of the vertically arranged channel layers;
   a vertical sidewall spacer formed on sidewalls of the source structure and the drain structure, having a bottom surface that is at a same height as a bottom surface of the source structure and the drain structure; and
   a gate stack formed over, around, and between the vertically arranged channel layers.

15. The semiconductor device of claim 14, wherein the source structure and drain structure are epitaxially grown from vertical side surfaces of the vertically arranged channel layers to form a continuous crystal structure therewith.

16. The semiconductor device of claim 15, wherein the vertical sidewall spacer confines the source structure and the drain structure to a horizontal dimension that is smaller than would have resulted from unconstrained epitaxial growth and in alignment with a channel width.

17. The semiconductor device of claim 14, further comprising an interlayer dielectric formed over the source structure and drain structure and over the vertical sidewall spacer.

18. The semiconductor device of claim 17, wherein the interlayer dielectric is formed from a distinct material as compared to a material of the vertical sidewall spacer.

19. The semiconductor device of claim 14, further comprising inner spacers formed between respective vertically adjacent pairs of the vertically arranged channel layers.

20. The semiconductor device of claim 14, wherein the source structure and the drain structure are each bounded on three vertical sides by the vertical sidewall spacer.

* * * * *